United States Patent
Miyaura

[19]
[11] Patent Number: 6,080,284
[45] Date of Patent: Jun. 27, 2000

[54] SPUTTERING APPARATUS AND METHOD FOR MANUFACTURING COMPOUND THIN FILM

[75] Inventor: Tomoko Miyaura, Habikino, Japan

[73] Assignee: Minolta Co., Ltd., Osaka, Japan

[21] Appl. No.: 09/018,491

[22] Filed: Feb. 4, 1998

[30] Foreign Application Priority Data

Feb. 5, 1997 [JP] Japan ................... 9-022503

[51] Int. Cl.$^7$ .................................. C23C 14/34
[52] U.S. Cl. ................ 204/192.12; 204/298.07; 204/298.08; 204/298.11; 204/298.19
[58] Field of Search .............. 204/298.11, 298.08, 204/298.07, 298.19, 192.12

[56] References Cited

U.S. PATENT DOCUMENTS

| | | | |
|---|---|---|---|
| 4,572,842 | 2/1986 | Dietrich et al. ........................ | 427/571 |
| 4,824,544 | 4/1989 | Mikalesen et al. ................... | 204/298 |
| 4,901,667 | 2/1990 | Suzuki et al. ......................... | 118/719 |
| 4,931,158 | 6/1990 | Bunshah et al. ................... | 204/192.29 |
| 4,988,424 | 1/1991 | Woodward et al. ............... | 204/192.29 |
| 5,164,221 | 11/1992 | Someno et al. ....................... | 427/575 |
| 5,178,739 | 1/1993 | Barnes et al. ..................... | 204/192.12 |
| 5,228,963 | 7/1993 | Rose ................................. | 204/192.12 |
| 5,401,350 | 3/1995 | Patrick et al. ....................... | 156/345 |
| 5,415,753 | 5/1995 | Hurwitt et al. ................... | 204/192.12 |
| 5,516,403 | 5/1996 | Forster et al. ..................... | 204/192.12 |

FOREIGN PATENT DOCUMENTS 8199355  8/1996  Japan.

OTHER PUBLICATIONS

Jpn. J. Appl. Phys. vol. 34 (1995) pp. L1332–L1335; Part 2, No. 10B, Oct. 15, 1996; Nakamura et al; "Superbright Green InGaN Single–Quantum–Well–Structure Light–Emitting Device".

*Primary Examiner*—Nam Nguyen
*Assistant Examiner*—Julian A. Mercado
*Attorney, Agent, or Firm*—Sidley & Austin

[57] ABSTRACT

A compound thin film, conforming to the stoichiometry, can be obtained by a magnetron sputtering method employing a thin film manufacturing apparatus wherein the film forming portion of the vacuum chamber is separated from the sputtering portion of the vacuum chamber by a multi-apertured partition, whereby sputtered molecules are permitted to pass through the apertures of the partition while sputter gas ions are hindered from passing through the apertures of the partition. The composition of the resulting compound thin film conforms to the stoichiometry of its components.

27 Claims, 4 Drawing Sheets

6,080,284

SPUTTERING APPARATUS AND METHOD FOR MANUFACTURING COMPOUND THIN FILM

RELATED APPLICATION

This application is based on Japanese Patent Application 09-022503, filed in Japan on Feb. 5, 1997, the content of which is hereby incorporated herein in its entirety by reference.

FIELD OF THE INVENTION

The present invention relates to a sputtering apparatus and method for manufacturing a compound thin film. In a particular aspect, the invention relates to a magnetron sputtering apparatus and method for manufacturing a compound thin film.

BACKGROUND OF THE INVENTION

The sputtering method has been widely used conventionally as a film forming method. A prior art sputtering apparatus is shown in FIG. 7. In that apparatus, a cathode 9 and a substrate holder 2 are positioned in a vacuum container 1, and a substrate 3 to be coated is placed on the substrate holder 2. A thin-plate-shaped coating material 5, called a target, is placed on the cathode 9. The substrate holder 2 and the cathode 9 concurrently serve as electrodes. The vacuum container 1 is provided with a gas inlet conduit 4 for introducing a sputtering gas into the vacuum container 1 to sputter the coating material from the target 5.

The apparatus of FIG. 7 is operated by placing the substrate 3 on the substrate holder 2 and then reducing the pressure inside the vacuum container 1 to a value in the range of $1 \times 10^{-1}$ to $1 \times 10^{-3}$ Torr via the vacuum pump PU, which is connected to the vacuum container 1 via an exhaust valve 8. A suitable sputtering gas, e.g., argon, is introduced into the vacuum chamber 1 via the gas inlet conduit 4 to displace any air in the vacuum container 1. In this vacuum state, a voltage is applied between the substrate holder 2 and the cathode 9 by the power source W in order to generate an electric discharge, thereby putting the argon gas into a plasma state, and the resulting argon ions drive molecules of the coating material out of the target 5 on the cathode 9. This phenomenon of the argon ions driving out molecules of the coating material from the target is referred to as sputtering, and the sputtered coating material is deposited as a thin film on the substrate 3, which is positioned on the substrate holder 2. The film forming method by means of the sputtering phenomenon is generically called the sputtering method.

The cathode 9 can be provided with a plurality of built-in magnets for the purpose of increasing the plasma density for the improvement of a film forming rate. Such cathode is referred to as a magnetron cathode. While any suitable cathode can be employed, the sputtering method is generally implemented by the magnetron sputtering method using this magnetron cathode.

A known proposition for improving the sputtering method is illustrated in FIG. 8. For example, Japanese Patent Laid-Open (A) 8-199355 discloses the method of positioning a coil-shaped electrode 17 between the cathode 9 and the substrate holder 2 inside the vacuum container 1 of the aforementioned general sputtering apparatus, and ionizing or exciting molecules are driven out of the target 5 by sputtering, achieved by applying a high frequency voltage to this coil-shaped electrode 17. Further, in applying the high frequency voltage to the cathode 9, there is disclosed a device for avoiding a mutual interference by making the frequency of the high frequency voltage, which is applied to the coil 17 by the power source P, differ from the frequency of the high frequency voltage, which is applied to the cathode 9 by the power source W.

However, as both the sputtering of the target material from the target 5 and the depositing of the sputtered material onto the substrate 3 to form the film take place in a common chamber, the argon gas used for the sputtering is excited again by the coil 17 to which the high frequency voltage is applied, possibly causing etching of the substrate 3 by the argon gas in the film forming process. Consequently, the film forming rate can be extremely retarded and/or some of the argon can be incorporated into the film, resulting in a problem in that a film conforming to stoichiometry cannot be obtained as well as a problem in that the surface of the resulting film is rough.

OBJECTS AND SUMMARY OF THE INVENTION

It is an object of the present invention to obtain a compound thin film, conforming to stoichiometry. Another object of the invention is to provide a sputtering apparatus for manufacturing the above-mentioned compound thin film conforming to stoichiometry. Another object of the invention is to provide an improved sputtering method of manufacturing a compound thin film.

The present invention provides a sputtering apparatus comprising a vacuum container having a partition, with a multi-aperture section, which separates the vacuum chamber into a sputtering chamber and a film forming chamber, with the target being in the sputtering chamber and the substrate being in the separate film forming chamber. In a presently preferred embodiment, the sputtering apparatus incorporates a magnetron cathode in the sputtering chamber. A coil can be positioned in the vacuum chamber between the partition and the substrate and a high frequency voltage can be applied to the coil. A sleeve can be positioned in the film forming chamber between the partition and the substrate in order to concentrate the sputtered molecules in the pathway between the multi-aperture section and the substrate. This sleeve can be provided with multiple inlets for the film forming gas, at least some of which can be in opposition to each other.

Also, the present invention provides a sputtering method which comprises the steps of:

placing a substrate and a target material inside a vacuum container, wherein an apertured partition divides the vacuum container into a cathode chamber and a film forming chamber, the substrate being in the film forming chamber and the target material being in the cathode chamber;

providing a sputtering gas inside the cathode chamber;

executing sputtering of the target material in the cathode chamber; and depositing on the substrate target material which has been sputtered by the sputtering gas and which has passed through the apertured partition. In a presently preferred embodiment, the sputtering is executed with the target material being positioned in a magnetic field inside a magnetron cathode chamber. The pathway of the sputtered molecules between the apertured partition and the substrate can be restricted so as to increase the density of the sputtered molecules in the pathway.

BRIEF DESCRIPTION OF THE DRAWINGS

These and other objects and features of the present invention will become apparent from the following description of a preferred embodiment thereof, taken in conjunction with the accompanying drawings, in which.

DETAILED DESCRIPTION OF THE PREFERRED EMBODIMENTS

In the following description, like parts are designated by like reference numbers throughout the several drawings, and a detailed description thereof is not repeated.

Figure 1:
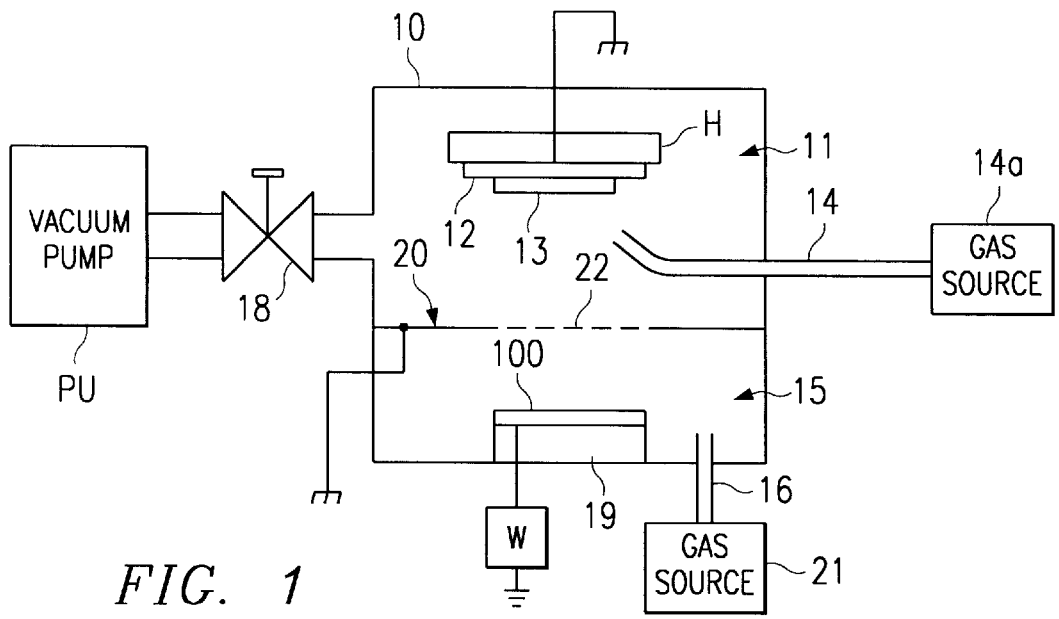
FIG. 1 is a schematic structural view of a sputtering manufacturing apparatus in accordance with a first embodiment of the present invention.

A sputtering apparatus in accordance with a first embodiment of the invention is shown in FIG. 1. In this apparatus, the vacuum chamber of the vacuum container 10 is internally separated into a film forming chamber 11 and a magnetron cathode chamber 15 by a partition 20. The magnetron cathode chamber 15 is internally provided with a magnetron cathode 19 and an inlet conduit 16 for introducing a sputtering gas from the sputtering gas source 21. A substrate holder 12 is positioned in the film forming chamber 11 in order to hold a substrate 13 on which a compound thin film is to be formed. The pressure inside the vacuum container 10 can be reduced by the vacuum pump PU, which is connected to the film forming chamber 11 of the vacuum container 10 via the exhaust valve 18. A material substance 100, called a target, for generating sputter molecules, can be positioned as part of the magnetron cathode 19. The gas inlet conduit 14 is connected to a source 14a of a suitable film forming gas, with the outlet of the gas inlet conduit 14 being positioned in the film forming chamber 11 between the substrate 12 and the partition 20. Suitable film forming gases include nitrogen, oxygen, hydrogen, hydrocarbon, or the like, and mixtures of any two or more thereof.

The substrate holder 12 can be provided with at least one heater H which can appropriately heat the substrate 13. The heater H can have a configuration such that the substrate holder 12 is directly heated by a heating wire or a configuration such that the substrate holder 12 is indirectly heated by a halogen lamp or the like.

Figure 2:
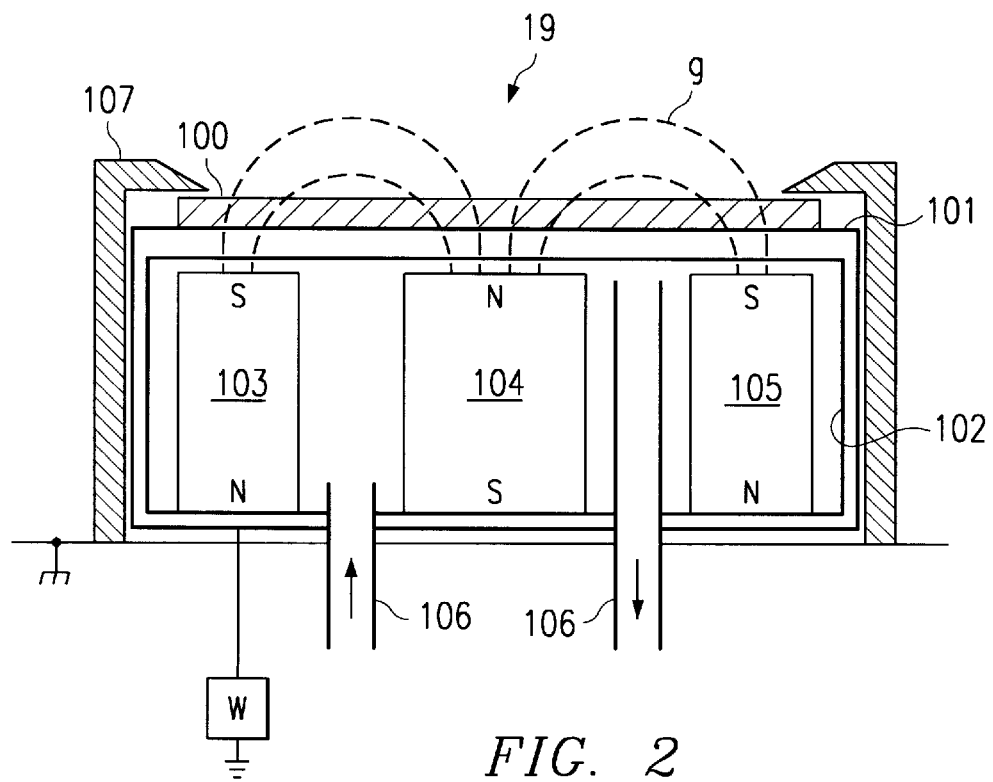
FIG. 2 is a schematic sectional view of a magnetron cathode which can be employed in a magnetron sputtering manufacturing apparatus in accordance with the present invention.

Referring to FIG. 2, the magnetron cathode 19 is constructed of the target 100; a backing plate 101; an electrode 102; a plurality of magnets 103, 104 and 105; the cooling water passages 106; the target cover 107; etc. The target 100 is the source of a material substance to be sputtered in order to form the molecules to be deposited on the substrate 13, and the target material is selected in accordance with the objective thin film material to be formed as a film on the substrate. For example, aluminum metal is used as the target when the objective thin film material is an aluminum compound. Similarly, when the objective thin film material is a carbon compound or a silicon compound, it is proper to use carbon or silicon, respectively, as the target material.

The backing plate 101 is electrically conductive, and the target 100 is made to function as a cathode electrode together with the electrode 102, which is electrically insulated from the housing of the vacuum container 10 and is connected to one terminal of the power source W, the other terminal of the power source W being grounded.

The target cover 107 is electrically conductive and is made to have a ground potential. In this case, when a high frequency voltage is applied to the cathode 19 by the power source W, a trigger discharge is generated between the target 100 and the target cover 107. A suitable sputtering gas, e.g., argon gas, is introduced into the magnetron cathode chamber 15 from the source 21 via the inlet conduit 16. When the high frequency voltage is applied to the target 100 by the power source W, the trigger discharge is generated between the target cover 107 and the target 100, by which the sputtering gas is ionized to generate plasma. The ionized sputtering gas ions sputter the target 100, e.g. aluminum, etc., thereby generating molecules, ions, and the like from the target 100.

Although the high frequency voltage is applied by the power source W in the present embodiment, it is acceptable to use a direct current power source so that the plasma is generated by the direct current. According to the present invention, the application power value is preferably higher than in the normal case because the movement of the sputtering gas is hindered by the partition 20. However, when the application power value is increased, there is a concern as to a tendency that the quality of the film to be formed will be degraded; therefore, the power to be applied is preferably in the range of about 2 to about 7 W/cm$^2$ of exposed surface area of the target 100.

As the target 100 functions as the cathode electrode as described above, an electric field is formed between the target 100, in the sputtering chamber 15, and the substrate holder 12, which is grounded inside the film forming chamber 11, thereby keeping the plasma stable. The magnets 103, 104 and 105 form a magnetic field g which intersects the electric field formed between the target 100 and the substrate holder 12. With this arrangement, the plasma is confined in a space restrained by this magnetic field g, and the target 100 is sputtered at a relatively high rate. Furthermore, the density of the sputtered molecules generated by the sputtering process becomes higher than in the case where the magnetic field g is absent; therefore, the film quality of the thin film to be finally deposited on the substrate 13 is improved.

Although the electric field is formed between the target 100 and the substrate holder 12 by grounding the substrate holder 12 in the present embodiment, it is also acceptable to increase the electric field intensity by applying a bias voltage to the substrate 13 by a direct current power source, thereby increasing the rate of movement of the film forming gas ions or the like.

The partition 20 has a function of interrupting the flow of the aluminum ions and argon gas ions which are the sputter gas ions, and preferentially permitting the aluminum molecules to pass through the partition 20 into the film forming chamber 11. In the present embodiment, the partition 20 has at least one multi-aperture section 22. As a material for the partition 20, it is preferable to use a non-magnetic metal in order to prevent the magnetic fields of the magnets 103–105, inside the magnetron cathode 19, from mutually interfering with the multi-aperture section 22. Any suitable non-magnetic metal, for example, stainless steel 304, stainless steel 316, molybdenum, tungsten, aluminum, etc., can be used for the partition 20. The multi-aperture section 22 is provided in the partition 20 in order to allow the sputtered molecules to pass through it and move into the film forming chamber 11 while minimizing the flow of sputter gas ions into the film forming chamber 11.

Figure 3A:
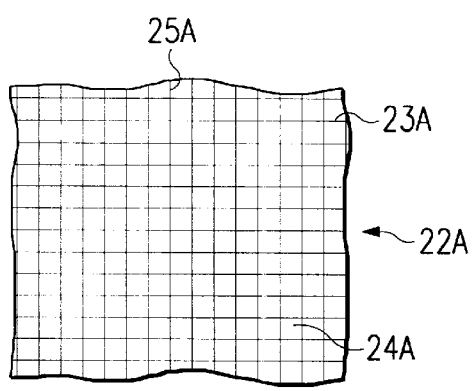
FIGS. 3(A) through 3(E) are views showing various constructions of a multi-aperture section of the partition of the sputtering manufacturing apparatus of the present invention.
Figure 3B:
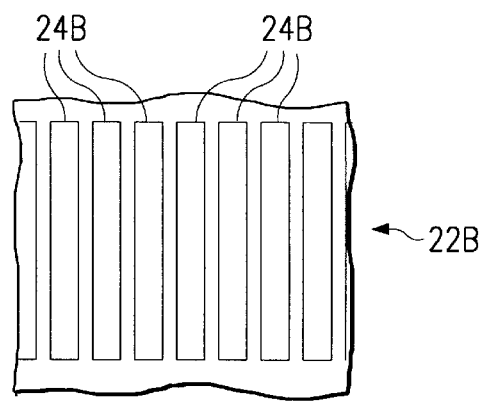
Figure 3C:
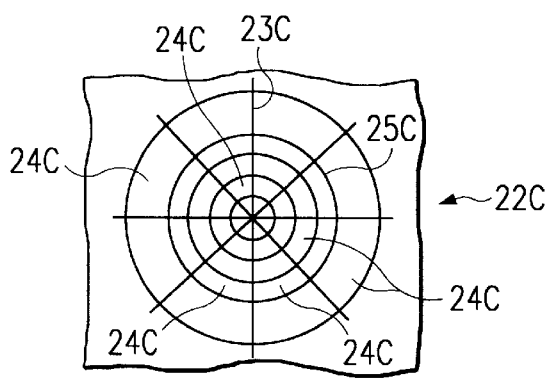
Figure 3D:
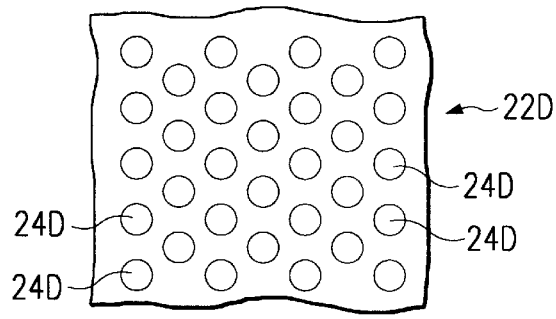
Figure 3E:
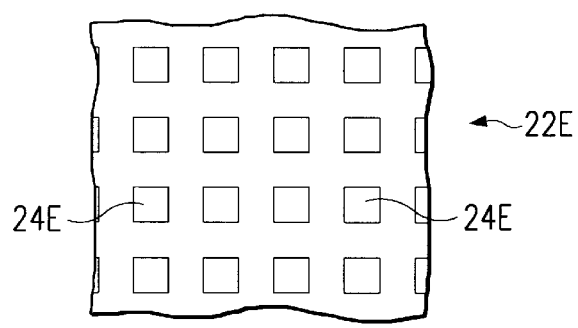

Each multi-aperture section 22 of the present invention can be defined as having any suitable shape, e.g., one having a mesh shaped section, a grating-shaped section, a donut-shaped section, etc., which produces a similar effect in the present invention. For example, shapes 22A–22E, as shown in FIGS. 3(A) through 3(E), can be utilized as the multi-aperture section. However, the present invention is not limited to the illustrated multi-aperture sections, and any shape, that produces the function of interrupting the flow of the sputtering gas ions and preferentially passing the sputtered molecules into the film forming chamber 11, is acceptable. FIG. 3(A) is an illustration of a portion of a mesh shaped section 22A which is formed by a first plurality of generally parallel members 23A intersecting a second plurality of generally parallel members 25A to form a plurality of apertures 24A. The members of each of the first and second pluralities in FIG. 3(A) can be wires. FIG. 3(B) is an example of a multi-aperture section 22B wherein each aperture 24B has an elongated slit shape with the plurality of apertures 24B being positioned generally parallel to and spaced apart from each other. FIG. 3(C) is an example of a donut (or concentric circle) shaped section 22C having a plurality of arcuate apertures 24C formed by a plurality of radial members 23C intersecting a plurality of concentric annular ring members 25C. The radial and ring members in FIG. 3(C) can be wires or other suitable construction. FIG. 3(D) is an example of a punched net shaped section 22D having a plurality of generally circular apertures 24D, which are spaced apart from each other. FIG. 3(E) is an example of a grating shape having a plurality of generally rectangular apertures 24E which are spaced apart from each other.

In the preferred embodiment, the partition 20 is a solid wall except for the openings in the multi-aperture section 22. The apertures in the section 22 extend completely through the partition 20 from the cathode chamber side of the partition 20 to the film forming side of the partition 20. The total open area of the apertures of each embodiment of the multi-aperture section 22 is preferably in the range of about 30% to about 50% of the total surface area of the film forming side of the section 22. While the dimensions of each aperture 24 can be any suitable values, the narrower dimension of each aperture 24 will generally be in the range of about 0.25 mm to about 5 mm. When the section 22 is formed in the mesh shape of FIG. 3(A), it is preferable that the number of parallel wires 23A extending in the first direction be in the range of about 10 to about 100 wires per inch (mesh count/one inch) and that the number of parallel wires 24A extending in the second direction be in the range of about 10 to about 100 wires per inch. When the multi-aperture section is formed with slits, as in FIG. 3(B), the width of each slit aperture 24B is preferably in the range of about 1 mm to about 3 mm. When the multi-aperture section is formed in the donut shape, the open radial interval between the concentric rings 25C is preferably in the range of about 0.5 mm to about 3 mm. When the multi-aperture section 22 is formed with circular or rectangular punched apertures, each punched hole size is preferably in the range of about 1 mm to about 3 mm.

The partition 20 is made to have the ground potential. This arrangement is adopted for the purpose of preventing, or at least minimizing, the passage through the partition 20 of any ions that have been introduced via the inlet conduit 16 and contributed to the sputtering or the ions generated through the sputtering of the target 100 by the plasma. Eventually, only the sputtered molecules, generated from the target 100 by the sputtering, are introduced from the magnetron cathode chamber 15 into the film forming chamber 11 via the multi-aperture section 22.

In regard to the gas flow rates through the gas inlet conduits 14 and 16, it is preferable to set the gas flow rates so that the pressure in the magnetron cathode chamber 15 is greater than the pressure in the film forming chamber 11, i.e., the degree of vacuum of the film forming chamber 11 is greater than the degree of vacuum of the magnetron cathode chamber 15. This arrangement is adopted for the reason that the movement of the sputter molecules tends to be hindered by the partition 20 in the present invention and for the purpose of promoting the movement by providing a pressure difference.

As described above, by virtue of the combination of the partition 20 having the ground potential with the arrangement that the inlet conduit 16, for introducing the sputtering gas, is positioned in the magnetron cathode chamber 15, not in the film forming chamber 11, the sputtering gas ions have difficulty in reaching the film forming chamber 11. This arrangement prevents the possible retardation of the film forming rate as a consequence of the etching of the substrate 13 by the sputtering gas ions as well as the possible incorporation of the sputtering gas into the substrate 13. Thus, the invention avoids a reduction in the adhesion force and does not produce a rough film surface.

Figure 4:
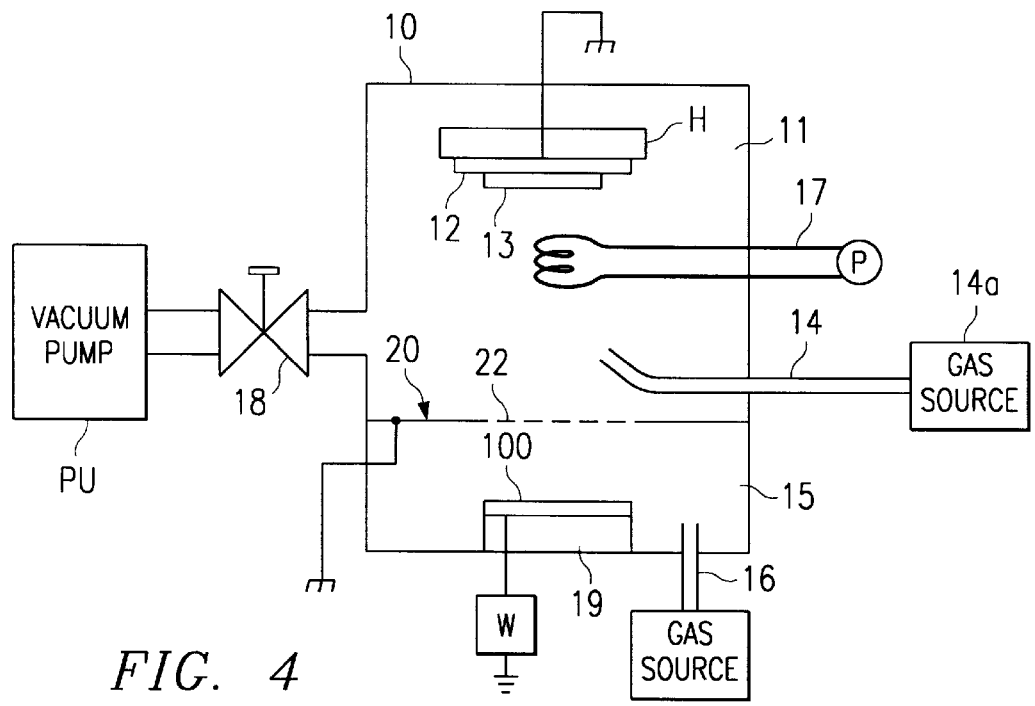
FIG. 4 is a schematic structural view of a sputtering manufacturing apparatus incorporating a high frequency coil in accordance with a second embodiment of the present invention.

Referring now to FIG. 4, the second embodiment of the invention is formed by incorporating the high frequency coil 17 into the first embodiment. The coil-shaped electrode 17 is positioned in the film forming chamber 11, between the substrate 13 and the partition 20, and is connected to a high-frequency power source P. The outlet of the gas inlet conduit 14 is positioned in the film forming chamber 11 between the substrate 12 and the partition 20.

The electrode 17 is used for exciting and/or ionizing the film forming gas, which is introduced via the gas inlet conduit 14, by the application of a high frequency voltage for causing those actions. Further, the electrode 17 is used for exciting or ionizing the sputtered molecules which pass from the magnetron cathode chamber 15 through the multi-apertured section 22 of the partition 20 into the film forming chamber 11 or for causing those actions with the film forming gas. The electrode 17 can have a shape other than the coil-like shape, e.g., a ring-like shape, a flat-plate-like shape, a shape of a combination of flat plates, a shape of a slightly rounded flat plate, or the like.

The power to be applied by the power source P is preferably set in the range of about 10 to 100 W, at which the plasma can be maintained. It is to be noted that the power is preferably set so that the power applied by the power source W is greater than the power applied by the power source P. This arrangement is adopted for the reason that the etching of the substrate 13 attributed to the power applied by the power source P becomes greater than the film forming rate of the target when the power applied by the power source W is relatively smaller than the power applied by the power source P, causing a concern that the film growth rate will be retarded. Although the power source P is a high frequency power source in the present embodiment, a direct current power source, which excites and maintains the plasma with a direct current, can be used.

A suitable film forming gas, e.g. oxygen or nitrogen, is passed from the gas source 14a through the gas inlet conduit 14 into the film forming chamber 11, and a high frequency voltage is applied to the electrode 17 to generate an atmosphere of oxygen plasma or nitrogen plasma in the film forming chamber 11. The sputtered molecules, generated in the magnetron cathode chamber 15, pass through this plasma in order to oxidize or nitride the sputtered molecules, and the resultant oxide or nitride molecules are deposited on the substrate 13, allowing a sufficient oxide film or nitride film to be obtained. For example, when the target 100 is aluminum and nitrogen gas is introduced via the gas inlet conduit 14, an aluminum nitride compound is deposited as a thin film on the substrate 13. Similarly, by using carbon or silicon as the target and introducing hydrogen gas via the gas inlet conduit 14, a diamond-like carbon or an amorphous silicon is deposited on the substrate 13. It is acceptable to provide a plurality of gas inlet conduits 14 and to simultaneously introduce a plurality of film forming gases, which can be the same or different from each other.

As described above, the film forming gas and the sputtered molecules are excited again in the film forming chamber 11 by the electrode 17; therefore, the sputtered molecules sufficiently react with the film forming gas, allowing a compound conforming to the stoichiometry to be obtained.

Figure 5:
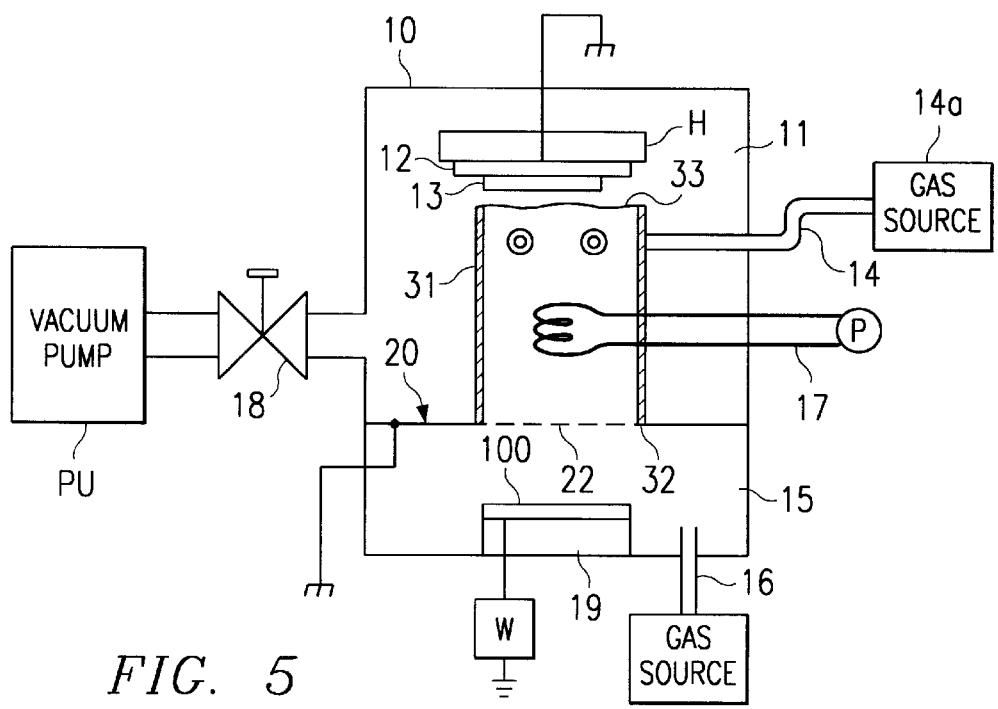
FIG. 5 is a schematic structural view of a sputtering manufacturing apparatus incorporating a sleeve encompassing the path of the sputtered molecules between the partition and the substrate in accordance with a third embodiment of the present invention.
Figure 6:
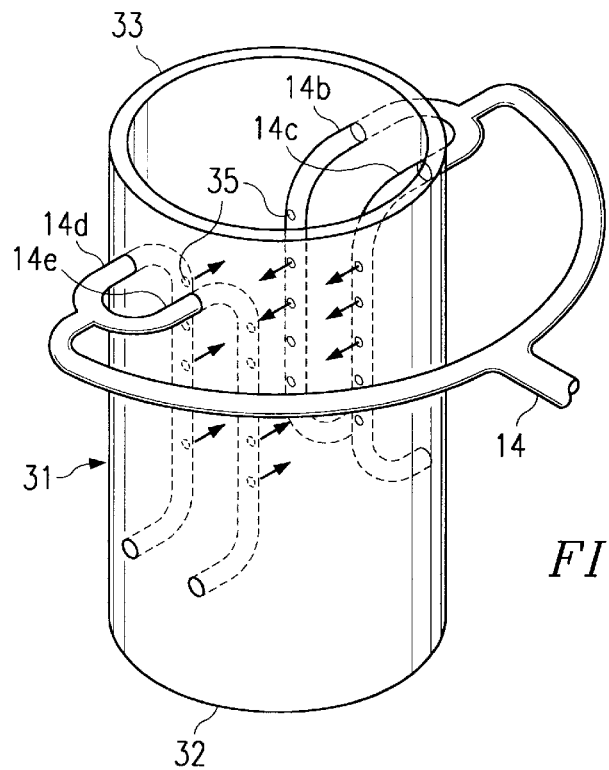
FIG. 6 is a perspective view of the sleeve of FIG. 5 with a modification of the film forming gas inlets.

Referring now to FIGS. 5 and 6, the third embodiment of the invention is formed by incorporating the sleeve 31 into either the first embodiment or the second embodiment. The sleeve 31 is formed of an electrically non-conducting material, e.g. silicon dioxide, and is positioned in the film forming chamber with a longitudinal axis of the sleeve 31 being on a line which extends from the multi-aperture section 22 to the substrate holder 12, and is grounded to the partition 20. The sleeve 31 has an internal diameter which is on the order of the diameter of the apertured section 22 of the partition 20, with one open end 32 of sleeve 31 being positioned on the partition 20 and the other open end 33 of the sleeve 31 being adjacent to but spaced from the substrate 13. In the illustrated embodiment, the target 100, the multi-aperture section 22, the sleeve 31, and the substrate holder can be considered to have a common central axis. Thus, the sleeve 31 encompasses the path of the sputtered molecules between the apertured section 22 and the substrate 13, reducing the diameter of the space available to the sputtered molecules, thereby increasing the density of the sputtered molecules in the path by minimizing any straying of the sputtered molecules from the path between the apertured section 22 and the substrate 13. The sleeve 31 is preferably readily removable from the vacuum container 11, so that when the inner wall of the sleeve 31 becomes excessively contaminated with sputtered molecules, it can be removed and replaced with a new sleeve, thus simplifying the maintenance of the vacuum container apparatus. While the sleeve 31 has been illustrated as having a circular cross section perpendicular to its longitudinal axis, other cross sectional shapes can be employed. While FIG. 5 shows the coil 17 as being positioned within the space defined by the sleeve 31, the coil 17, if employed, can be positioned exteriorly of the outer surface of the sleeve 31.

Also, as shown in FIGS. 5 and 6, the film forming gas inlet conduit 14 can be provided with a plurality of branch conduits 14b, 14c, 14d, and 14e which direct the film forming gas into the interior space of the sleeve 31. In FIG. 5, the branch conduits 14b, 14c, 14d, and 14e extend through the sleeve 31 at a level close to the substrate 13 (between the coil 17 and the substrate 13 if the coil 17 is present), since it is desirable that the film forming gas which is supplied through the gas inlet conduit 14 should form a body of the film forming gas close to the substrate 13 in order to enhance the film forming speed. The branch conduits 14b and 14c are spaced apart a short distance from each other and are in direct opposition to the branch conduits 14d and 14e, which are spaced apart from each other a similar short distance but on the opposite side of the sleeve 31, so that the gas flow through branch conduit 14b is in opposition to the gas flow through branch conduit 14d, and the gas flow through branch conduit 14c is in opposition to the gas flow through branch conduit 14e. If desired, the plurality of branch conduits can be spaced apart at equal intervals about the circumference of the sleeve 31.

In the modification of the film forming gas inlet illustrated in FIG. 6, each of the branch conduits 14b–14e extends through the sleeve 31 at a level adjacent the substrate 13 and then extends downwardly, parallel to the longitudinal axis of sleeve 31, with each of the branch conduits 14b–14e being provided with a plurality of orifices 35 therein which face inwardly, generally toward the central region of the space defined by the sleeve 31, in order to direct a plurality of streams of film forming gas towards the central region of the space defined by the sleeve 31. The downward extension of the branch conduits 14b–14e can be selected so as to provide the desired volume of the film forming gas within the sleeve 31 and adjacent to the substrate 13. Other configurations and arrangements of the film forming gas inlet can be employed.

INVENTION EXAMPLE 1

A representative method for obtaining an aluminum nitride (AlN) compound thin film conforming to stoichiometry by using the sputtering apparatus having the construction illustrated in FIGS. 2 and 4 will be described below.

The multi-aperture section of the partition 20 is formed as a mesh shape, and specifically a stainless steel SUS304 of 30 meshes (produced by NIRAKO Co., LTD., Product No. 758030), which is a non-magnetic material, is used to form the partition 20. Quartz is used for the substrate 13. In the magnetron cathode 19, aluminum (Al: having a purity of 99.9999%) is used as the target 100. The aluminum target is set on the backing plate 101.

While heating the substrate 13 to a temperature of about 400° C., the air inside the vacuum container 10 is discharged to achieve a pressure in the vacuum container 10 of about $10^{-7}$ Torr. Next, nitrogen is introduced into the film forming chamber 11 via the gas inlet conduit 14 to achieve a pressure in the film forming chamber 11 of about $2 \times 10^{-4}$ Torr, and argon is introduced into the magnetron cathode chamber 15 via the argon inlet conduit 16 to achieve a pressure in the magnetron cathode chamber 15 of about $3 \times 10^{-3}$ Torr.

Subsequently, a high frequency voltage of 13.56 MHz is applied by the power source P to the electrode 17 in the film forming chamber 11 at a power of 50 W, and the exhaust valve 18 is adjusted to provide a pressure in the film forming chamber 11 of about $10^{-3}$ Torr, thereby generating a nitrogen plasma in the film forming chamber 11.

Thereafter, a high frequency voltage of 13.56 MHz is applied by the power source W to the magnetron cathode 19 at a power of 300 W for the generation of an argon gas plasma, thereby sputtering the aluminum which serves as the target 100. The sputtered aluminum molecules pass through the multi-aperture section 22 of the partition 20 and enter the film forming chamber 11, while the argon ions are hindered from passing through the multi-aperture section 22 due to the ground potential of the partition 20. A nitrogen plasma is generated in the film forming chamber 11 by the electrode 17; therefore, the aluminum molecules are nitrided while passing through this region to become aluminum nitride which is then deposited on the quartz substrate 13, consequently forming an aluminum nitride film conforming to stoichiometry. It is to be noted that the conformation to stoichiometry defined in the present invention means that the element ratio approximately coincides with the molar ratio expressed by the chemical formula. For example, in the case of aluminum nitride, when aluminum nitride approximately coinciding with the molar ratio expressed by the chemical formula AlN (Al:N=1:1) is formed, the state is in conformation to the stoichiometry. If the molar ratio of Al:N=1.1:1, the state is aluminum rich.

In this embodiment, the partition 20 is made to have the ground potential. With this arrangement, the argon ions used for the sputtering or the etched aluminum ions disappear by the ground potential. Only the aluminum molecules pass through the multi-aperture section to be introduced from the magnetron cathode chamber 15 into the film forming chamber 11. In combination with the arrangement that the argon gas inlet conduit 16 for the sputtering use is positioned in the magnetron cathode chamber 15, not in the film forming chamber 11, the argon ions have difficulty in reaching the film forming chamber 11, and this prevents the possible retardation of the film forming rate due to an etching effect produced by re-excited argon or the like as well as the possible incorporation of argon into the film during the film forming process. Thus the invention causes neither a reduction in the adhesion force nor a roughness of the film surface.

Furthermore, by making the partition 20 have the ground potential, a shield is provided between the film forming chamber 11 and the magnetron cathode chamber 15 for electrically isolating each chamber from the other. Therefore, it is not necessary to make the frequency of the high-frequency power source P, applied to the electrode of the film forming chamber 11, differ from the frequency of the high-frequency power source W, applied to the magnetron cathode, as the high frequencies do not interfere with each other in such configuration.

The aluminum nitride film produced in this Inventive Example is designated as Sample 1.

COMPARATIVE EXAMPLES

As comparative examples, two examples will be shown. The general sputtering apparatus of FIG. 7 is used in the Comparative Example 1, and the apparatus of FIG. 8 (a case similar to the disclosure of Japanese Laid-Open Patent Application No. Hei 8-199355) is used in Comparative Example 2.

Comparative Example 1

The present comparative example is according to the method of sputtering aluminum using an aluminum target and nitrogen as the sputtering gas.

Figure 7:
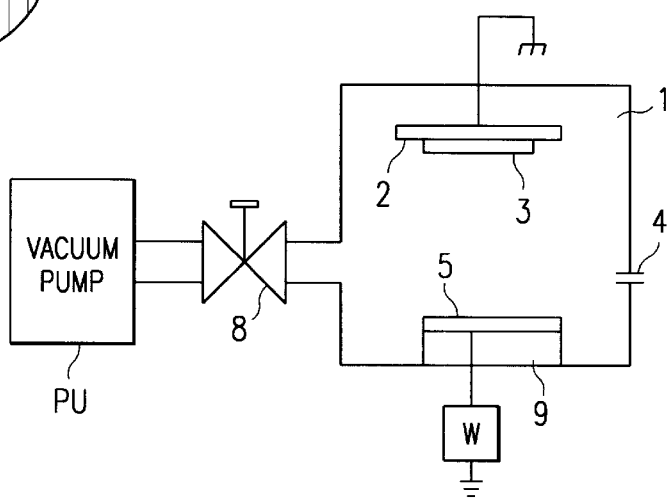
FIG. 7 is a schematic structural view showing a first example of a prior art magnetron sputtering manufacturing apparatus.
Figure 8:
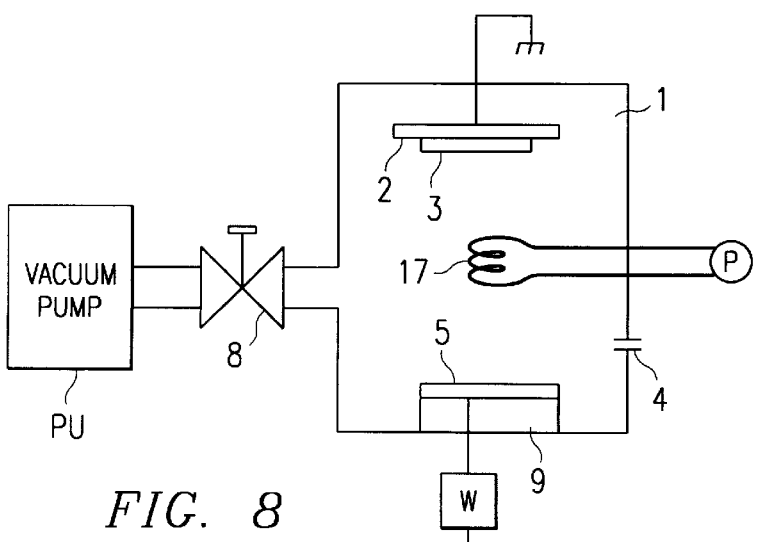
FIG. 8 is a schematic structural view showing a second example of a prior art magnetron sputtering manufacturing apparatus incorporating a high frequency coil.

First, the substrate 3 is sufficiently cleaned and set on the substrate holder 2 in the vacuum apparatus shown in FIG. 7. While heating the substrate 3 to a temperature of 400° C., the air inside the vacua container 1 is discharged to a pressure of $2\times10^{-7}$ Torr.

Next, nitrogen is introduced via the gas inlet conduit 4 into the vacuum container 1 to a pressure of $5\times10^{-4}$ Torr, and the pressure inside the vacuum container 1 is set to a pressure of $5\times10^{-3}$ Torr by adjusting the exhaust valve 8.

Subsequently, when a high frequency voltage of 13.56 MHz is applied to the magnetron cathode 9 at a power of 300 W, a nitrogen plasma is generated to sputter the aluminum. The sputtered aluminum molecules are nitrided while passing through the nitrogen plasma to become aluminum nitride. This aluminum nitride is deposited on the quartz of the substrate, forming an aluminum nitride film (designated as Sample 2).

Comparative Example 2

According to the present comparative example, sputtering was executed under the same conditions of Invention Example 1 except for the absence of the mesh used in Invention Example 1.

A mixed plasma of nitrogen and argon is generated in the film forming chamber, and aluminum molecules are nitrided while passing through this region to become aluminum nitride (the resulting film is designated as Sample 3).

FILM COMPOSITION ANALYSIS

The three samples obtained as Invention Example 1 and Comparative Examples 1 and 2 were subjected to composition analysis by the Auger analysis method. The results are shown in Table 1, with the percentages being mol percent.

TABLE 1

| Sample | Nitrogen | Aluminum | Composition |
|---|---|---|---|
| 1 (Invention Example 1) | 45.41% | 46.90% | Al:N = 1:1 |
| 2 (Comparative Example 1) | 33.45% | 60.33% | Al:N = 2:1 |
| 3 (Comparative Example 2) | 40.67% | 46.39% | Al:N = 1.1:1 |

The above results show that a thin film in which aluminum nitride conforms to the stoichiometry is obtained according to the present invention. Each of the comparative, examples has the tendency to become aluminum rich, and a thin film conforming to the stoichiometry is not obtained.

Next, the film forming rates and the film adhesion properties of these three samples were compared with one another. Table 2 shows the results.

TABLE 2

| Sample | Film Forming Rate | Adhesion Property |
|---|---|---|
| 1 (Invention Example 1) | 16 Å/min | 430 Kg/cm$^2$ |
| 2 (Comparative Example 1) | 30 Å/min | 380 Kg/cm$^2$ |
| 3 (Comparative Example 2) | 2 Å/min | 50 Kg/cm$^2$ |

From the above results, it is apparent that Sample 3 has an extremely slow film forming rate due to the influence of the argon plasma, and its film adhesion property is inferior to that of the present invention.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

That which is claimed is:

1. A sputtering apparatus comprising:
    a vacuum container having a film forming chamber and a cathode chamber;
    a partition which separates the film forming chamber and the cathode chamber from each other;
    a cathode positioned in the cathode chamber for supporting a target material; and
    a substrate holder positioned in the film forming chamber for supporting a substrate;
    wherein said partition has a multi-aperture section which permits passage therethrough of sputtered molecules from the cathode chamber into the film forming chamber; and
    a sleeve, formed of electrically non-conductive material, positioned in said film forming chamber between the multi-aperture section and the substrate holder such that an extension of a longitudinal axis of said sleeve extends from said multi-aperture section to said substrate holder.

2. A sputtering apparatus in accordance with claim 1, wherein the multi-aperture section is made of an electrically conductive material.

3. A sputtering apparatus in accordance with claim 1, further comprising a power supply for applying a voltage between said cathode and said substrate holder.

4. A sputtering apparatus in accordance with claim 1, wherein the multi-aperture section is made of an electrically conductive material and is electrically connected to said substrate holder.

5. A sputtering apparatus in accordance with claim 1, further comprising a sputtering gas inlet connected to the cathode chamber for introducing a sputtering gas into the cathode chamber, and a film forming gas inlet connected to the film forming chamber for introducing a film forming gas into the film forming chamber.

6. A sputtering apparatus in accordance with claim 1, further comprising a valve, and a vacuum pump having an inlet connected to said film forming chamber via said valve.

7. A sputtering apparatus in accordance with claim 1, wherein said cathode is a magnetron cathode.

8. A sputtering apparatus in accordance with claim 1, wherein total aperture open area of the multi-aperture section is in the range of about 30% to about 50% of the total surface area of a film forming side of the multi-aperture section.

9. A sputtering apparatus in accordance with claim 8, wherein a narrower dimension of each aperture of the multi-aperture section is in the range of about 0.25 mm to about 5 mm.

10. A sputtering apparatus in accordance with claim 1, wherein a narrower dimension of each aperture of the multi-aperture section is in the range of about 0.25 mm to about 5 mm.

11. A sputtering apparatus in accordance with claim 1, further comprising a first power supply for applying a voltage between said cathode and said substrate holder; and
    wherein the multi-aperture section is made of an electrically conductive material and is electrically connected to said substrate holder.

12. A sputtering apparatus in accordance with claim 11, further comprising a sputtering gas inlet connected to the cathode chamber for introducing a sputtering gas into the cathode chamber, and a film forming gas inlet connected to the film forming chamber for introducing a film forming gas into the film forming chamber.

13. A sputtering apparatus in accordance with claim 12, further comprising a valve, and a vacuum pump having an inlet connected to said film forming chamber via said valve; and wherein said cathode is a magnetron cathode.

14. A sputtering apparatus in accordance with claim 13, wherein a total aperture open area of the multi-aperture section is in the range of about 30% to about 50% of the total surface area of a film forming side of the multi-aperture section.

15. A sputtering apparatus in accordance with claim 14, wherein a narrower dimension of each aperture of the multi-aperture section is in the range of about 0.25 mm to about 5 mm.

16. A sputtering apparatus in accordance with claim 15, further comprising:
    an electrode positioned in the film forming chamber between the substrate holder and the partition; and
    a second power source for applying a high frequency voltage to said electrode; and
    wherein the multi-aperture section is made of a non-magnetic metal.

17. A sputtering apparatus in accordance with claim 16, wherein the first power supply for applying a voltage between said cathode and said substrate holder comprises a first power source for applying a high frequency voltage between said cathode and said substrate holder, wherein the frequency of the high frequency voltage applied between said cathode and said substrate holder is the same as the frequency of the high frequency voltage applied to said electrode.

18. A sputtering apparatus comprising:
    a vacuum container having a film forming chamber and a cathode chamber;
    a partition which separates the film forming chamber and the cathode chamber from each other;
    a cathode positioned in the cathode chamber for supporting a target material; and
    a substrate holder positioned in the film forming chamber for supporting a substrate;
    wherein said partition has a multi-aperture section which permits passage therethrough of sputtered molecules from the cathode chamber into the film forming chamber;
    a power supply for applying a first voltage between said cathode and said substrate holder, said first voltage having a first frequency;
    an electrode positioned in the film forming chamber between the substrate holder and the partition; and
    a power source for applying a second voltage to said electrode, said second voltage having a second frequency which is at least substantially equal to said first frequency.

19. A sputtering method comprising the steps of:
    placing a substrate inside a film forming chamber;
    placing a target material in a cathode chamber;
    providing a partition including at least one multi-aperture section wherein said partition separates said film forming chamber from said cathode chamber;
    providing a sputtering gas, which contributes to sputtering of target material, in said cathode chamber;

providing a film forming gas, which contributes to film formation, inside the film forming chamber;

sputtering the target material in the cathode chamber so as to generate a plurality of sputtered molecules;

providing a sleeve of electrically non-conductive material, said sleeve being positioned in said film forming chamber between the multi-aperture section and the substrate holder such that an extension of a longitudinal axis of said sleeve extends from said multi-aperture section to said substrate holder, wherein said sleeve restricts the sputtered molecules from straying from a pathway between said multi-aperture section and said substrate; and depositing on the substrate sputtered molecules which have reacted with the film forming gas.

20. A sputtering method in accordance with claim 19, wherein the step of sputtering comprises applying a voltage between the target material and the substrate.

21. A sputtering method in accordance with claim 20, wherein said multi-aperture section is formed of electrically conductive material, and wherein the step of depositing comprises providing a voltage level to said substrate that is substantially equal to a voltage level of said multi-aperture section.

22. A sputtering method in accordance with claim 19, wherein total aperture open area of the multi-aperture section is in the range of about 30% to about 50% of the total surface area of a film forming side of the multi-aperture section.

23. A sputtering method in accordance with claim 19, wherein a narrower dimension of each aperture of the multi-aperture section is in the range of about 0.25 mm to about 5 mm.

24. A sputtering method in accordance with claim 19, wherein the step of sputtering comprises executing sputtering with the target material placed in a magnetic field inside the cathode chamber.

25. A sputtering method in accordance with claim 19, wherein the step of sputtering comprises applying a first voltage between the target material and the substrate, said first voltage having a first frequency; and wherein the step of depositing comprises applying a second voltage to an electrode which is positioned between said multi-aperture section and said substrate, said second voltage having a second frequency which is at least substantially equal to said first frequency.

26. A sputtering method in accordance with claim 19, wherein the step of providing a film forming gas comprises introducing the film forming gas into the film forming chamber via a plurality of inlets.

27. A sputtering method in accordance with claim 26, wherein the plurality of inlets are positioned along the circumference of a pathway between said multi-aperture section and said substrate.

* * * * *